(12) United States Patent
Tokuyama et al.

(10) Patent No.: US 9,433,134 B2
(45) Date of Patent: Aug. 30, 2016

(54) POWER SEMICONDUCTOR MODULE AND POWER CONVERTER USING THE SAME

(75) Inventors: Takeshi Tokuyama, Tokyo (JP); Kinya Nakatsu, Tokyo (JP); Ryuichi Saito, Hitachinaka (JP); Toshiya Satoh, Hitachinaka (JP); Tokihito Suwa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 267 days.

(21) Appl. No.: 14/126,955

(22) PCT Filed: Jun. 15, 2012

(86) PCT No.: PCT/JP2012/065345
§ 371 (c)(1),
(2), (4) Date: Dec. 17, 2013

(87) PCT Pub. No.: WO2012/176706
PCT Pub. Date: Dec. 27, 2012

(65) Prior Publication Data
US 2014/0118934 A1 May 1, 2014

(30) Foreign Application Priority Data
Jun. 24, 2011 (JP) .................. 2011-140059

(51) Int. Cl.
*H05K 7/20* (2006.01)
*H05K 7/14* (2006.01)
(Continued)

(52) U.S. Cl.
CPC ........... *H05K 7/2089* (2013.01); *H01L 23/367* (2013.01); *H01L 23/4334* (2013.01);
(Continued)

(58) Field of Classification Search
CPC ....... H01L 23/34; H01L 21/00; H01L 23/26; H01L 23/473; H01L 25/07; H01L 2225/1094; H01L 2924/3511; H01L 25/072; H01L 29/00; H05K 7/20927; H02M 7/003; Y02T 10/7077
USPC ........ 165/80.2–80.4, 104.33; 174/15.1, 16.3; 257/E21.002, E21.103, E21.418, 257/E23.104, E29.257, 278, 618, 625, 659, 257/675, 688, 691, 706–707, 712–714, 257/717–720, 726–727; 361/687, 689–690, 361/697–699, 702–704, 709–711, 715–716
See application file for complete search history.

(56) References Cited

U.S. PATENT DOCUMENTS 3,909,678 A * 9/1975 Rifkin .................... H01L 23/44
174/15.1
6,542,365 B2 * 4/2003 Inoue .................. H01L 23/4006
165/80.4

(Continued)

FOREIGN PATENT DOCUMENTS

JP 2007-35670 A 2/2007
JP 2009-159815 A 7/2009
(Continued)

OTHER PUBLICATIONS

International Search Report with English translation dated Sep. 11, 2012 (5 pages).

*Primary Examiner* — Zachary M Pape
*Assistant Examiner* — Amir Jalali
(74) *Attorney, Agent, or Firm* — Crowell & Moring LLP

(57) ABSTRACT

A power semiconductor module includes a first package having an upper arm circuit section, a second package having a lower arm circuit section, a metal case having a storage space to store the first package and the second package and an opening connecting with the storage space, and an intermediate connecting conductor to couple the upper arm circuit section with the lower arm circuit section; the case includes a first radiating section and a second radiating section facing the first radiating section through the storage space; the first package is arranged so that the arrangement direction of the first and second packages may be parallel to the respective surfaces facing the first and second radiating sections; and the intermediate connecting conductor couples an emitter side terminal extending from the first package with a collector side terminal extending from the second package in the storage space.

5 Claims, 9 Drawing Sheets

(51) Int. Cl.
*H01L 25/11* (2006.01)
*H01L 25/18* (2006.01)
*H01L 23/367* (2006.01)
*H01L 23/433* (2006.01)
*H01L 23/00* (2006.01)
*H02M 7/00* (2006.01)
*H01L 23/473* (2006.01)

(52) U.S. Cl.
CPC ............ *H01L24/33* (2013.01); *H01L 25/115* (2013.01); *H01L 25/18* (2013.01); *H02M 7/003* (2013.01); *H05K 7/1432* (2013.01); *H05K 7/209* (2013.01); *H01L 23/473* (2013.01); *H01L 2224/32245* (2013.01); *H01L 2924/07802* (2013.01); *H01L 2924/13055* (2013.01); *H01L 2924/13091* (2013.01); *H01L 2924/181* (2013.01)

(56) References Cited

U.S. PATENT DOCUMENTS

| | | | |
|---|---|---|---|
| 7,245,493 B2* | 7/2007 | Inagaki | H01L 23/4334 174/15.1 |
| 7,470,939 B2 | 12/2008 | Mochida et al. | |
| 7,671,465 B2* | 3/2010 | Funakoshi | H01L 23/3735 257/706 |
| 7,978,471 B2 | 7/2011 | Tokuyama et al. | |
| 8,416,574 B2 | 4/2013 | Tokuyama et al. | |
| 8,450,845 B2* | 5/2013 | Ikeda | H01L 23/3735 257/706 |
| 2007/0252169 A1* | 11/2007 | Tokuyama | H02M 7/003 257/162 |
| 2008/0186751 A1* | 8/2008 | Tokuyama | H01L 23/473 363/131 |
| 2009/0231811 A1* | 9/2009 | Tokuyama | H01L 23/36 361/699 |
| 2011/0299265 A1 | 12/2011 | Nakatsu et al. | |
| 2011/0310585 A1 | 12/2011 | Suwa et al. | |
| 2012/0087095 A1 | 4/2012 | Tokuyama et al. | |
| 2012/0300522 A1* | 11/2012 | Tokuyama | H01L 25/072 363/131 |
| 2013/0062724 A1* | 3/2013 | Tokuyama | H05K 7/1432 257/499 |
| 2013/0062751 A1* | 3/2013 | Takagi | H01L 23/3675 257/692 |
| 2013/0119525 A1* | 5/2013 | Tsuyuno | B60L 1/003 257/675 |
| 2013/0175678 A1* | 7/2013 | Ide | H01L 23/36 257/675 |
| 2014/0118934 A1* | 5/2014 | Tokuyama | H05K 7/1432 361/689 |
| 2014/0197532 A1* | 7/2014 | Ide | H01L 23/36 257/706 |

FOREIGN PATENT DOCUMENTS

| | | | | |
|---|---|---|---|---|
| JP | 2009-219270 A | | 9/2009 | |
| JP | 2010-110143 A | | 5/2010 | |
| JP | 2010-119299 A | | 5/2010 | |
| JP | 2010-119300 A | | 5/2010 | |
| JP | 2010-199622 A | | 9/2010 | |
| JP | 2010-258315 A | | 11/2010 | |
| JP | 2011-77464 A | | 4/2011 | |
| JP | 2012-5322 A | | 1/2012 | |
| WO | WO 2010050594 A1 * | | 5/2010 | ............. B60L 11/14 |
| WO | WO 2011136222 A1 * | | 11/2011 | ......... H01L 23/3675 |

\* cited by examiner (b)

(a)

(a)

(b)

POWER SEMICONDUCTOR MODULE AND
POWER CONVERTER USING THE SAME

TECHNICAL FIELD

The present invention relates: to a power semiconductor module for converting direct current to alternating current and a power converter using the power semiconductor module; and in particular to a power semiconductor module to supply alternating current to a drive motor of a hybrid vehicle or an electric vehicle and a power converter using the power semiconductor module.

BACKGROUND ART

In recent years, a power converter is required to be able to output a large current and on the other hand is also required to reduce the size. If a power converter tries to output a large current, heat generated in a power semiconductor element incorporated in a power semiconductor module increases, temperature reaches a heat resistant temperature of the power semiconductor element unless the thermal capacities of the power semiconductor module and the power converter are increased, and downsizing is hindered. In view of the situation, a both-side cooling type power semiconductor module to improve cooling efficiency by cooling a power semiconductor element from both sides is developed.

In a both-side cooling type power semiconductor module, both principal surfaces of a power semiconductor element are interposed between lead frames that are tabular conductors and the surfaces of the lead frames opposite to the surfaces facing the respective principal surfaces of the power semiconductor element are thermally coupled with a coolant and cooled.

Invention of configuring a semiconductor device by installing connecting terminals in a pair of metal bodies and electrically coupling the connecting terminals in order to electrically couple semiconductor packages each of which is formed by interposing a power semiconductor element between the paired metal bodies and sealing them with mold resin without interposing a bus bar is disclosed in Patent Literature 1.

CITATION LIST

Patent Literature

Patent Literature 1: Japanese Unexamined Patent Application Publication No. 2007-35670

SUMMARY OF INVENTION

Technical Problem

In the case of forming a semiconductor package having an upper arm circuit and a lower arm circuit as a package for one phase and installing the semiconductor packages for three phases, three semiconductor packages have to be installed. Further, in the case of forming a semiconductor package having an upper arm circuit or a lower arm circuit as a package for one phase and installing the semiconductor packages for three phases, six semiconductor packages have to be installed. In the case of increasing an output current, semiconductor packages are presumably coupled electrically in parallel at an upper arm circuit or a lower arm circuit and the number of the semiconductor packages increases further. For that reason, the improvement of the productivity of a semiconductor package comes to be important.

On the other hand, if the improvement of productivity leads to the increase of wiring inductance, the output of a power converter is hindered from increasing. In the event of switching operation of an inverter circuit constituting an upper arm circuit and a lower arm circuit for example, a transit current passing through the upper and lower arms flows and that is influenced by the parasitic inductance of wiring, causes bounced voltage, surge, and noise, and thus causes the increase of loss and the malfunction of a power semiconductor element.

A challenge of the present invention is to inhibit productivity from deteriorating and to reduce a wiring inductance.

Solution to Problem

According to an embodiment of the present invention: a power semiconductor module comprises a first package having an upper arm circuit section constituting an inverter circuit, a second package having a lower arm circuit section constituting an inverter circuit, a metal case having a storage space to store the first package and the second package and an opening connecting with the storage space, and an intermediate connecting conductor to couple the upper arm circuit section with the lower arm circuit section; the case includes a first radiating section and a second radiating section facing the first radiating section through the storage space; the first package includes a first semiconductor chip, a first conductor plate and a second conductor plate to interpose the first semiconductor chip, a first collector-side terminal coupled with the first conductor plate, a first emitter-side terminal coupled with the second conductor plate, and a first sealant to seal parts of the first conductor plate and the second conductor plate and the first semiconductor chip; the second package includes a second semiconductor chip, a third conductor plate and a fourth conductor plate to interpose the second semiconductor chip, a second collector-side terminal coupled with the third conductor plate, a second emitter-side terminal coupled with the fourth conductor plate, and a second sealant to seal parts of the third conductor plate and the fourth conductor plate and the second semiconductor chip; further, the first package is arranged so that the arrangement direction of the first package and the second package may be parallel to the respective surfaces facing the first radiating section and the second radiating section; the first collector-side terminal and the second emitter-side terminal protrude outside the case from the opening of the case; and the intermediate connecting conductor couples the first emitter-side terminal with the second collector-side terminal in the storage space of the case.

Advantageous Effects of Invention

The present invention makes it possible to inhibit productivity from deteriorating and to reduce a wiring inductance.

DESCRIPTION OF EMBODIMENTS

A power converter according to the present embodiment is hereunder explained in detail in reference to drawings.

Embodiment

Figure 1:
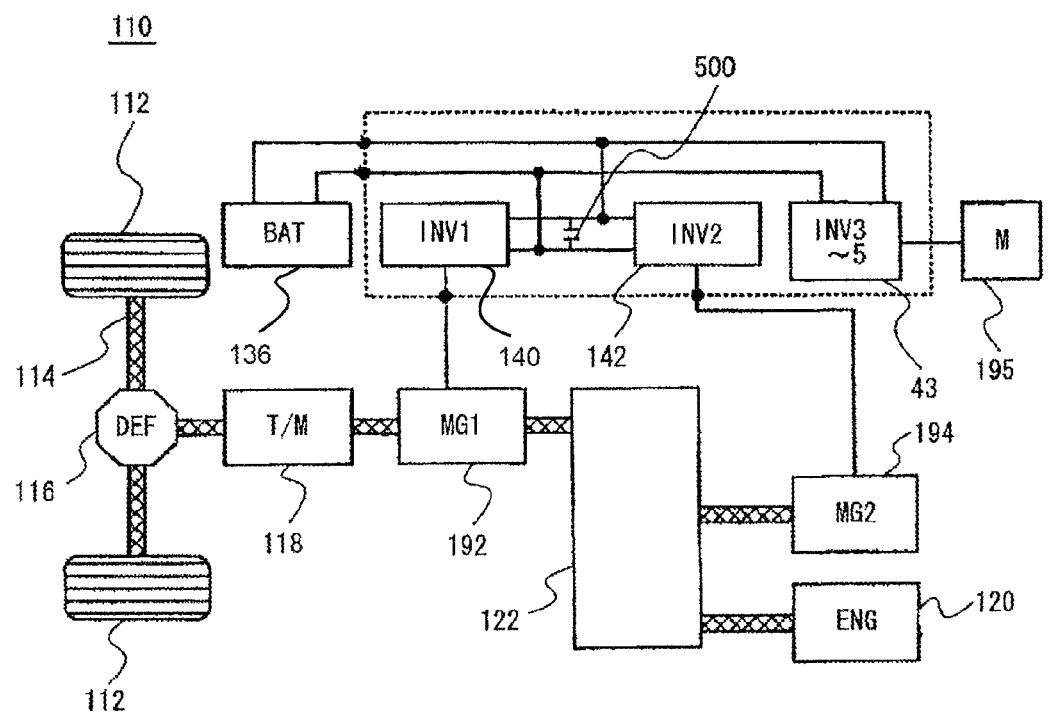
FIG. 1 is a view showing a control block of a hybrid vehicle.
Figure 2:
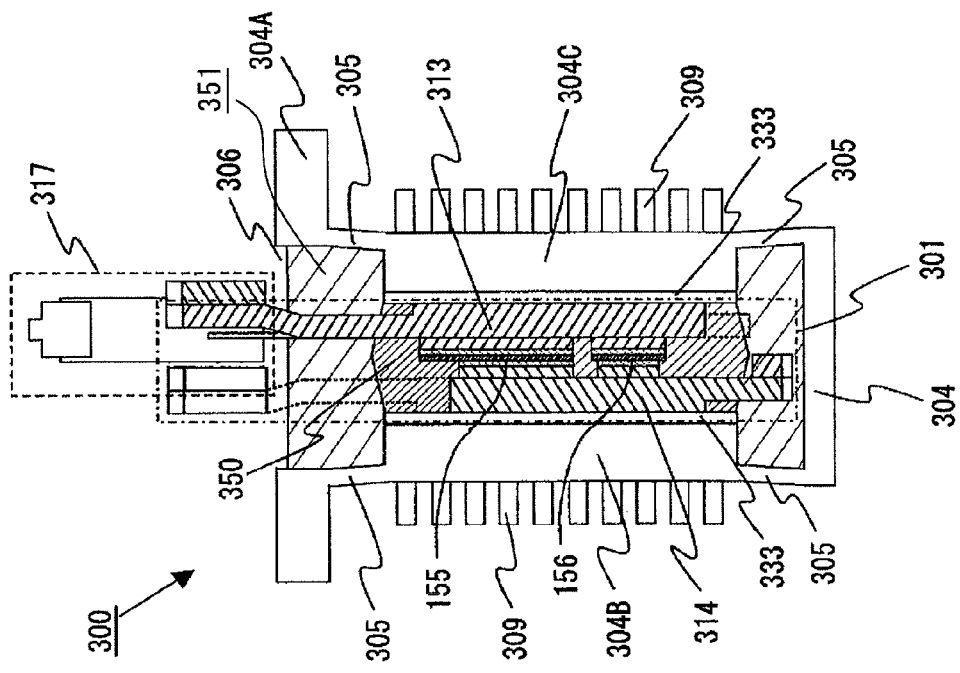
FIG. 2(a) is a perspective view of a power semiconductor module 300 according to the present embodiment and (b) is a sectional view of the power semiconductor module 300 according to the present embodiment.
Figure 2:
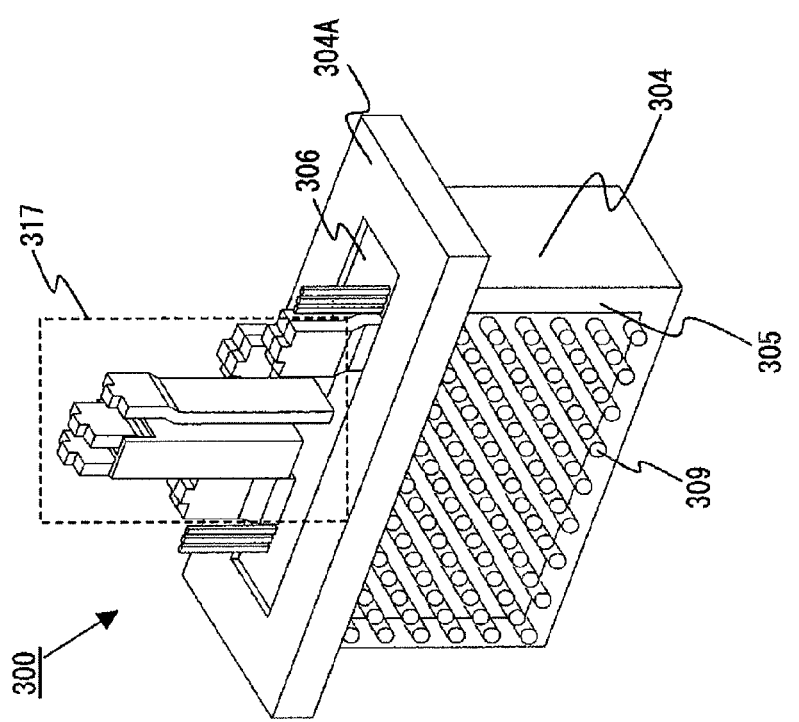

A power converter according to the present embodiment is applicable to a hybrid vehicle and a genuine electric vehicle and, as a representative example, a control configuration and a circuit configuration in the case of applying a power converter to a hybrid vehicle are explained in reference to FIGS. 1 and 2.

FIG. 1 is a view showing a control block of a hybrid vehicle.

A power converter according to the present embodiment is used for an electric system to drive a vehicle and is explained on the basis of an inverter for driving a vehicle requiring very severe mounting environment and operating environment.

An inverter for driving a vehicle: converts DC power supplied from an in-vehicle battery or an in-vehicle generator constituting an in-vehicle power source into prescribed AC power; supplies the obtained AC power to a motor for driving a vehicle; and controls the drive of the motor for driving a vehicle. Then, since a motor for driving a vehicle functions also as a power generator, the inverter for driving a vehicle also has the function of converting AC power generated by the motor for driving a vehicle into DC power in accordance with an operating mode.

Here, the configuration according to the present embodiment is best applicable to a power converter for driving a vehicle such as an automobile or a truck but is also applicable to another power converter such as a power converter for an electric train, a marine vessel, and an airplane, a power converter for industrial use used as a controller of a motor to drive equipment at a factory, or a power converter for domestic use used as a controller of a motor to drive a solar photovoltaic system at home or an electric appliance at home.

In FIG. 1, a hybrid electric vehicle (hereunder referred to as "HEV") 110 is an electromotive vehicle and has two vehicle driving systems. One is an engine system using an engine 120 that is an internal-combustion engine as a power source. The engine system is mainly used as a drive source of an HEV. The other is an in-vehicle electric system using motor generators 192 and 194 as power sources. The in-vehicle electric system is mainly used as a drive source of an HEV and an electric power generation source of the HEV. The motor generators 192 and 194 are synchronous machines or induction machines for example and operate as motors or electric generators in accordance with a drive mode and hence are called motor generators here.

A front wheel axis 114 is rotatably supported pivotally at the front of a vehicle body and a pair of front wheels 112 are installed at both ends of the front wheel axis 114. A rear wheel axis is rotatably supported pivotally at the rear of the vehicle body and a pair of rear wheels are installed at both the end of the rear wheel axis (not shown in the figure). Although a so-called front-wheel-drive method is adopted in an HEV according to the present embodiment, it is also possible to adopt a rear-wheel-drive method reversely.

A front-wheel-side differential gear (hereunder referred to as "front-wheel-side DEF") 116 is installed in the center of the front wheel axis 114. An output axis of a transmission 118 is mechanically coupled with the input side of the front-wheel-side DEF 116. An output side of the motor generator 192 is mechanically coupled with the input side of the transmission 118. An output side of the engine 120 and an output side of the motor generator 194 are mechanically coupled with the input side of the motor generator 192 through a power transfer mechanism 122. Here, the motor generators 192 and 194 and the power transfer mechanism 122 are contained in a chassis of the transmission 118.

A battery is electrically coupled with inverters 142 and electric power can be exchanged between the battery 136 and the inverters 142.

In the present embodiment, a first motor generator unit comprising the motor generator 192 and the inverter 140 and a second motor generator unit comprising the motor generator 194 and the inverter 142 are provided and they are used selectively in accordance with an operating state. That is, in the case of driving a vehicle by power from the engine 120 and assisting the drive torque of the vehicle, electric power is generated by activating the second motor generator unit as a generator unit by the power of the engine 120 and the first motor generator unit is activated as a motor unit by the electric power obtained by the electric generation. In a similar case of assisting the traveling speed of a vehicle, electric power is generated by activating the first motor generator unit as a generator unit by the power of the engine 120 and the second motor generator unit is activated as a motor unit by the electric power obtained by the electric generation.

In the present embodiment further, it is possible to drive a vehicle only by the power of the motor generator 192 by activating the first motor generator unit as a motor unit by the electric power of the battery 136. In the present embodiment furthermore, the battery 136 can be charged by activating the first motor generator unit or the second motor generator unit as a generator unit by the power of the engine 120 or the power from wheels and generating electric power.

The battery 136 is used also as a power source for driving a motor 195 for an auxiliary machine. The auxiliary machine is a motor to drive a compressor for an air conditioner or a motor to drive a hydraulic pump for control and DC power is supplied from the battery 136 to an inverter 43, converted into AC power at the inverter 43, and supplied to the motor 195. The inverter 43 has functions similar to the inverters 140 and 142 and controls the phase, the frequency, and the electric power of alternating current supplied to the motor 195. For example, the motor 195 generates torque by supplying AC power of a leading phase to the rotation of the rotor of the motor 195. In contrast, the motor 195 functions as an electric generator by generating AC power of a lagging phase and is operated in the state of regenerative breaking. The control function of the inverter 43 is the same as the control function of the inverters 140 and 142. Since the capacity of the motor 195 is smaller than the capacities of the motor generators 192 and 194, the maximum conversion electric power of the inverter 43 is smaller than those of the inverters 140 and 142 but the circuit configuration of the inverter 43 is basically the same as the circuit configurations of the inverters 140 and 142.

A power semiconductor module 300 according to the present embodiment is explained in reference to FIGS. 2 to 6.

FIG. 2(*a*) is a perspective view of a power semiconductor module 300 according to the present embodiment and FIG. 2(*b*) is a sectional view of the power semiconductor module 300 according to the present embodiment.

As shown in FIG. 2(*b*), an IGBT 155 that is a power semiconductor element and a diode 156 are respectively interposed between a collector conductor plate 313 and an emitter conductor plate 314 from both sides. The collector conductor plate 313 is coupled with a collector electrode of the IGBT 155 and a cathode electrode of the diode 156 through a metal bond and the emitter conductor plate 314 is fastened to an emitter electrode of the IGBT 155 and an anode electrode of the diode 156 through the metal bond.

A bus bar connector 317 stated later is formed by integrating wires and terminals and coupled with a terminal extending from the interior toward the exterior of a cooler 304.

The cooler 304 is made of metal, specifically comprises an aluminum alloy material such as Al, AlSi, AlSiC, Al—C, etc., and is a case member configured so as not to have an opening other than an insertion port 306. A flange 304A is formed on a plane of the cooler 304 where the insertion port 306 is formed. Further, the cooler 304 is arranged in the state where a first radiating section 304B and a second radiating section 304C having surfaces larger than the surface of the cooler 304 face each other. Here, the cooler 304 not necessarily has a precise rectangle and may have curved corners. By forming the cooler 304 so as to be a metal-made end-closed cylindrical case, even when the cooler 304 is inserted into a flow channel where a coolant such as water or oil flows, it is possible to secure sealing against the coolant with the flange 304A and hence prevent the coolant from intruding into the interior of the cooler 304 and a terminal section by a simple configuration.

Further, fins 309 are formed uniformly on the outer walls of the first radiating section 304B and the second radiating section 304C. Thin-wall sections 305 having a thickness thinner than the thicknesses of the first radiating section 304B and the second radiating section 304C are formed at an outer circumferential section surrounding the first radiating section 304B and an outer circumferential section surrounding the second radiating section 304C. The thickness of the thin-wall sections 305 is reduced to the extent of being able to deform the thin-wall sections 305 but not deforming the first radiating section 304B and the second radiating section 304C by applying pressure to the fins 309. As a result, by displacing the thin-wall sections 305 after a package 301 comprising the IGBT 155, the collector conductor plate 313, and others is inserted into the cooler 304, it is possible to bond the inner wall of the cooler 304 to the surface of the package 301 through an insulating member 333.

The package 301 is configured so as to seal the IGBT 155, the collector conductor plate 313, and others with a first sealing resin 350 and the whole package 301 is inserted into the cooler 304. A space remaining in the interior of the cooler 304 is filled with a second sealing resin 351.

Figure 3:
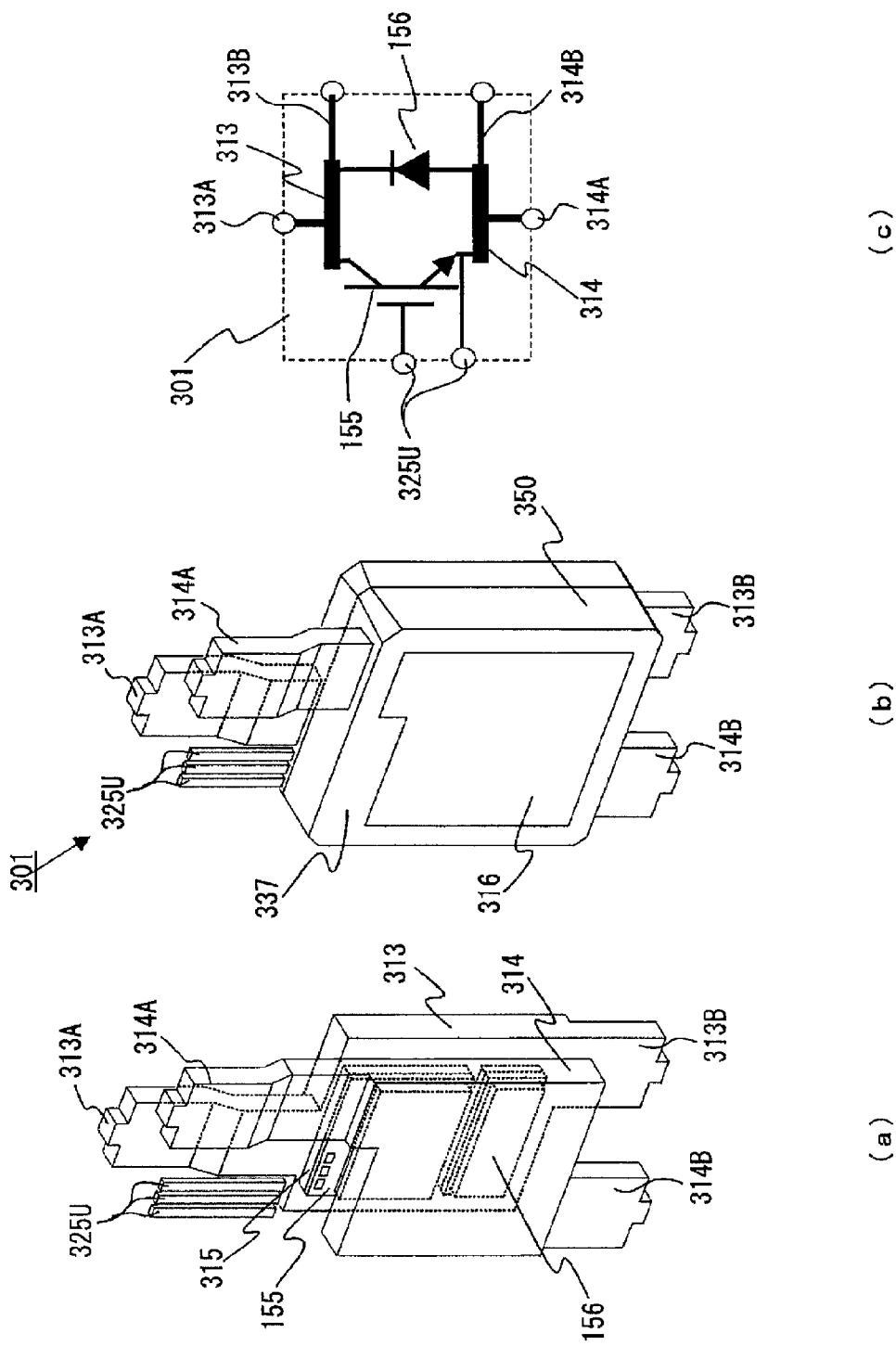
FIG. 3(a) shows an internal structure of a package 301 according to the present embodiment, (b) shows the package 301 in the state of being sealed with a first sealing resin 350, and (c) shows a circuit diagram corresponding to the package 301.

FIG. 3(*a*) shows an internal structure of a package 301 according to the present embodiment, FIG. 3(*b*) shows the package 301 in the state of being sealed with a first sealing resin 350, and FIG. 3(*c*) shows a circuit diagram corresponding to the package 301.

A package 301 according to the present embodiment, in an inverter circuit to convert direct current into alternating current of plural phases, constitutes a circuit corresponding to one arm in either of an upper arm circuit and a lower arm circuit in a series circuit for one phase comprising the upper arm circuit and the lower arm circuit.

An IGBT 155 and a diode 156 have tabular shapes, electrodes for metal bonding are installed on both the surfaces, a collector conductor plate 313 and an emitter conductor plate 314 are arranged in the manner of interposing the IGBT 155 and the diode 156 from both sides, and the electrodes are bonded to an element mounting section 315 installed in the collector conductor plate 313 and the emitter conductor plate 314 with a metal bond.

As the metal bond, a solder material, a brazing material, metal nanoparticles, and metal microparticles can be used. As a first sealing resin 350, a thermosetting resin material is suitably used and in particular an epoxy resin material the mechanical property of which comes close to a metal by being filled with filler is suitably used. Further, a MOSFET can also be used in place of the IGBT 155.

An external emitter terminal 314A and an internal emitter terminal 314B are installed in the emitter conductor plate 314 and protrude respectively from sides of the element mounting section 315 in the thickness direction. Further, an external collector terminal 313A and an internal collector terminal 313B are installed in the collector conductor plate 313 and protrude respectively from sides of the element mounting section 315 in the thickness direction. A signal wire 325U is arranged at a location adjacent to the external collector terminal 313A. On this occasion, the external collector terminal 313A and the signal wire 325U extend in an identical direction and in contrast the internal collector terminal 313B extends in the opposite direction.

Figure 4:
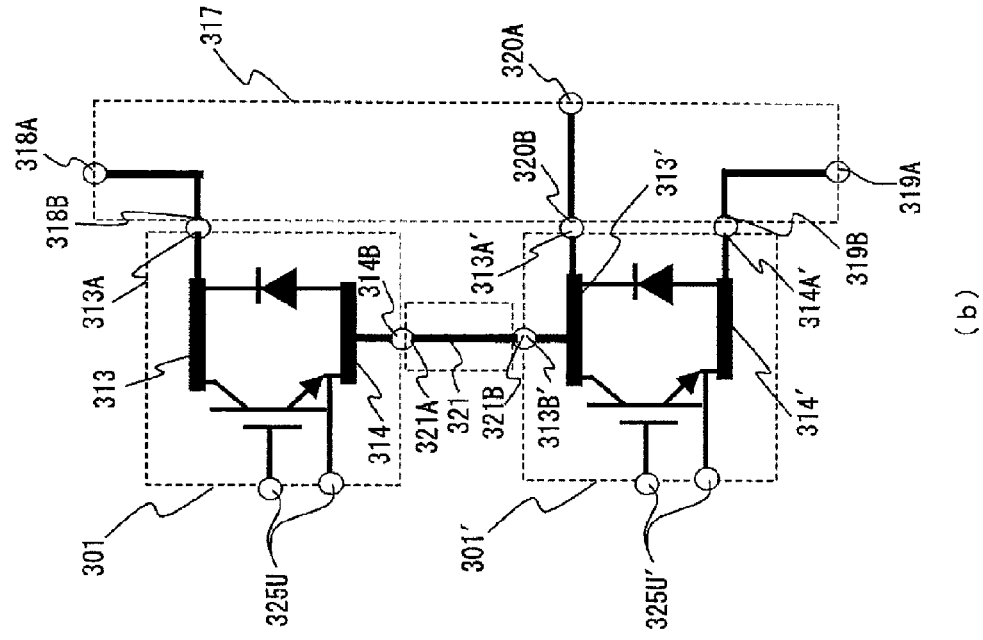
FIG. 4(a) shows a structure of coupling a package 301 and a reversed package 301' with a bus bar connector 317 and (b) shows a circuit diagram corresponding to (a).
Figure 4:
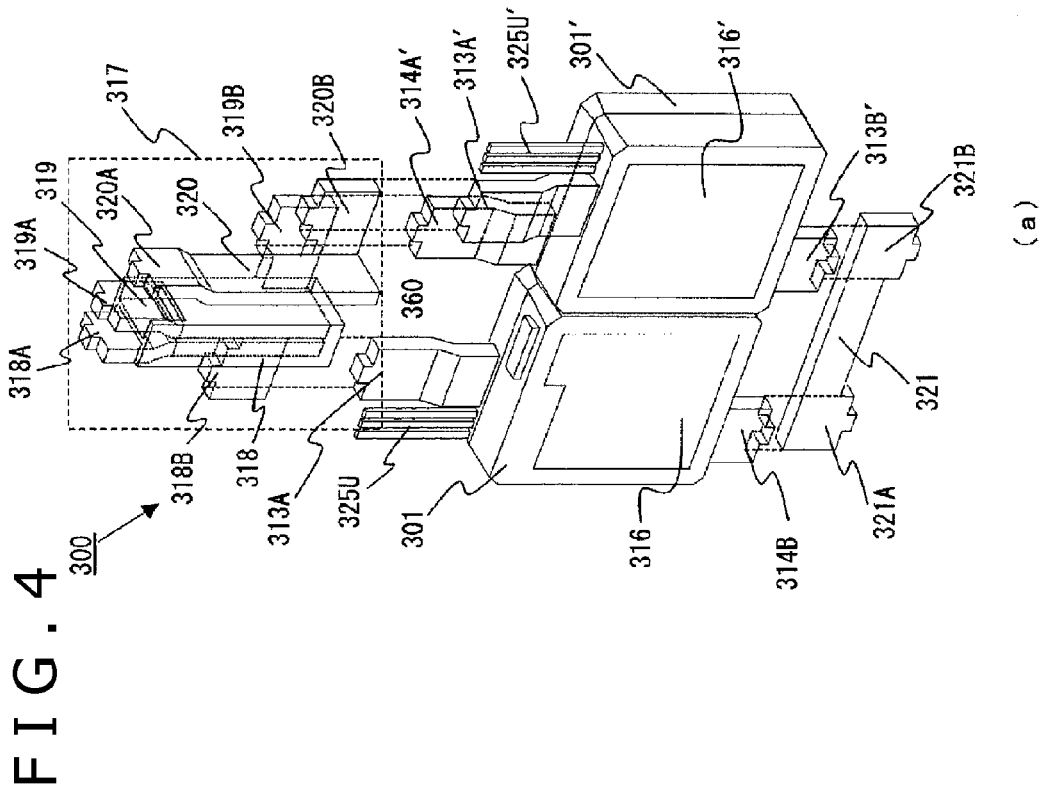
Figure 5:
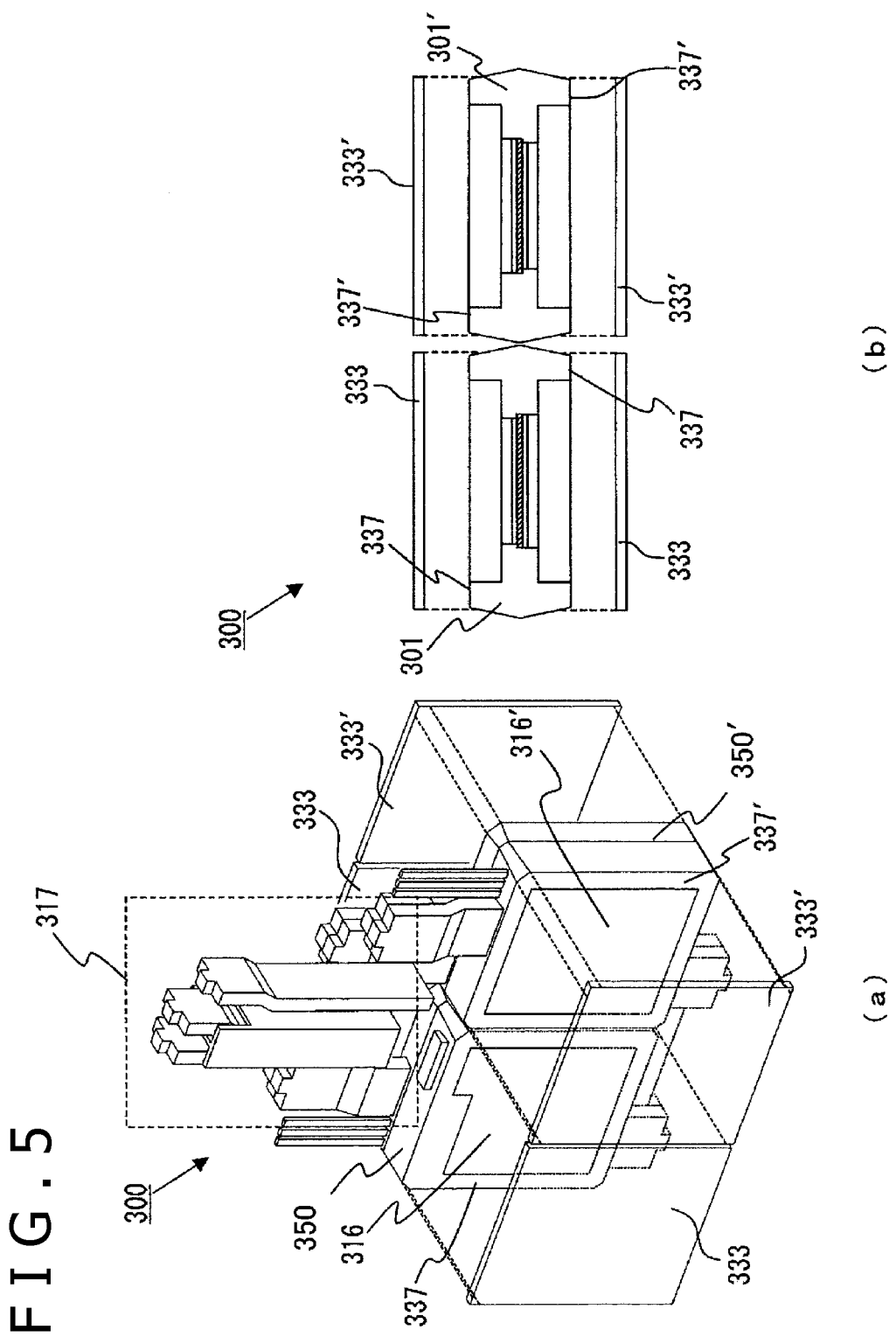
FIG. 5(a) is a view showing a process of bonding respective surfaces 337 and 337' of a first sealing resin 350 of a package 301 and a package 301' to insulating members 333 and 333' and (b) is a sectional view of the packages 301 and 301' to which the insulating members 333 and 333' are bonded.
Figure 6:
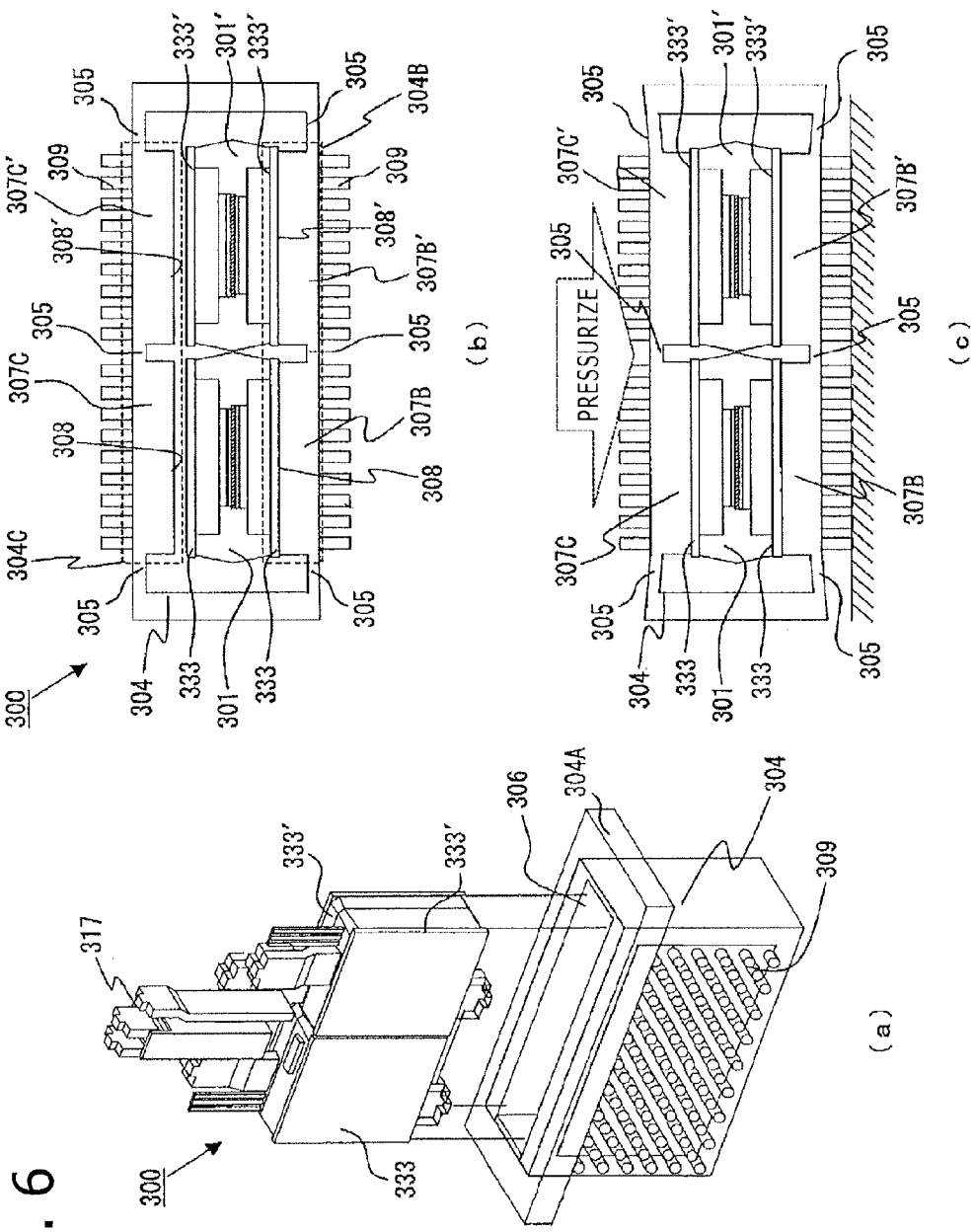
FIG. 6(a) is a perspective view showing a process of inserting a package 301 into a cooler 304. (b) and (c) are sectional views showing processes of bonding an inner wall of the cooler 304 to the package 301.

As shown in FIG. 3(*b*), the package 301 has a heat-transfer surface 316 comprising a part of the emitter conductor plate 314 exposed from a surface 337 of the first sealing resin 350. Likewise, as shown in FIGS. 4(*a*) and 5(*a*), the package 301' has a heat-transfer surface 316' comprising a part of the collector conductor plate 313' exposed from a surface 337' of a second sealing resin 350'. The collector conductor plate 313 has a heat-transfer surface comprising a part thereof and being exposed from the first sealing resin 350 likewise. The heat-transfer surface 316 transfers heat generated from the IGBT 155 and the diode 156 to a cooler 304 through an insulating member 333 stated below (FIG. 6).

The construction of an upper and lower series circuit using a package 301 corresponding to one arm is explained.

FIG. 4(a) shows a structure of coupling a package 301 and a reversed package 301' with a bus bar connector 317 and FIG. 4(b) shows a circuit diagram thereof.

The package 301' is formed by reversing a package 301 shown in FIG. 3 and arranged to a side of the package 301.

The package 301 and the package 301' are arranged so that a principal surface of an external collector terminal 313A of the package 301 and a principal surface of an external emitter terminal 314A' of the other package 301' may be an identical surface.

The external collector terminal 313A is coupled with a positive electrode connection terminal 318B of the bus bar connector 317. The external emitter terminal 314A' is coupled with a negative electrode connection terminal 319B of the bus bar connector 317. Further, an external collector terminal 313A' is coupled with an AC connection terminal 320B of the bus bar connector 317. As shown in FIG. 4(a), a signal wire 325U' is arranged at a location adjacent to the external collector terminal 313A'. On this occasion, the external collector terminal 313A' and the signal wire 325U' extend in an identical direction and in contrast the internal collector terminal 313B' extends in the opposite direction.

An intermediate connecting conductor 321 couples the package 301 constituting an upper arm circuit with the package 301' constituting a lower arm circuit in a cooler 304. A terminal 321A of the intermediate connecting conductor 321 is coupled with an internal emitter terminal 314B. A terminal 321B of the intermediate connecting conductor 321 is coupled with an internal collector terminal 313B'. The connection is carried out by metal bonding such as welding or brazing.

As a collector conductor plate 313, an emitter conductor plate 314, and the intermediate connecting conductor 321, a material having a high thermal conductivity and being able to be formed by press working or extrusion processing is suitable from the viewpoints of module cooling performance and productivity and a material of a Cu alloy system or an Al alloy system is considered as the candidate.

The bus bar connector 317 comprises a positive electrode conductor 318, a negative electrode conductor 319, an AC conductor 320, and an insulating member 360 arranged between the positive electrode conductor 318 and the negative electrode conductor 319. In the positive electrode conductor 318, a positive electrode terminal 318A is formed at an end and the positive electrode connection terminal 318B is formed at the other end integrally by insert molding or the like. In the negative electrode conductor 319, a negative electrode terminal 319A is formed at an end and the negative electrode connection terminal 319B is formed at the other end integrally by insert molding or the like. In the AC conductor 320, an AC terminal 320A is formed at an end and the AC connection terminal 320B is formed at the other end integrally by insert molding or the like. As the molding material, a thermosetting resin having a high heat resistance such as polyphenylene sulfide (PPS) or polybutylene terephthalate (PBT) is suitable.

The positive electrode conductor 318 and the negative electrode conductor 319 are bent respectively so that the negative electrode terminal 319A may face the positive electrode terminal 318A. The insulating member 360 is arranged between the positive electrode conductor 318 and the negative electrode conductor 319, the positive electrode conductor 318 and the negative electrode conductor 319 are in a laminated state having the insulating member 360 in between, and hence wiring inductance is reduced in the positive electrode conductor 318 and the negative electrode conductor 319.

As stated above, an upper and lower arm series circuit shown in FIG. 4(b) is formed. Here, unused terminals are cut. In this way, by separately modularizing and producing a package 301 constituting an upper arm circuit section and a package 301' constituting a lower arm circuit section, it is possible to reduce the number of contact sites of a metal bonding member to bond a switching element to a conductor plate. Consequently, it is possible to improve the productivity and yield of the package 301 and the package 301'.

FIG. 5(a) is a view showing a process of bonding respective surfaces 337 and 337' of a first sealing resin 350 of a package 301 and a first sealing resin 350' of a package 301', respectively, to insulating members 333 and 333' and FIG. 5(b) is a sectional view of the packages 301 and 301' to which the insulating members 333 and 333' are bonded.

Two insulating members 333 are installed, one insulating member 333 is bonded to the package 301 in the manner of covering a surface 337 and a heat-transfer surface 316 of the package 301, and the other insulating member 333 is bonded to the package 301 in the manner of covering the other surface and the other heat-transfer surface of the package 301. The insulating members 333' are also bonded to the package 301' likewise. At a process of this stage, the locations of the packages 301 and 301' and the insulating members 333 and 333' are decided.

As the insulating members 333 and 333', a material exhibiting adhesiveness by thermocompression to apply pressure from an exterior in the state of melting by heat is appropriate from the viewpoints of the reduction of voids and surface traceability and a resin insulating sheet material and an insulative bond material are considered.

FIG. 6(a) is a perspective view showing a process of inserting a package 301 into a cooler 304. FIGS. 6(b) and 6(c) are sectional views showing processes of bonding an inner wall of the cooler 304 to the package 301.

As shown in FIG. 6(a), two packages 301 and 301' to which insulating members 333 and 333' are attached temporarily are inserted through an insertion port 306 formed at a flange 304A of a cooler 304.

As shown in FIG. 6(b), the package 301 and the package 301' are arranged on a bonding surface 308 and a bonding surface 308' formed on the lower side of an inner wall of the cooler 304 respectively.

Then, as shown in FIG. 6(c), thin-wall sections 305 of the cooler 304 are displaced by applying pressure to the cooler 304 from an exterior under a high temperature and the bonding surfaces 308 and 308' formed on the upper side of the inner wall of the cooler 304 are bonded to the insulating members 333 and 333' respectively.

A first radiating section 304B of the cooler 304 faces an insulating member 333 and forms a base section 307B having a prescribed thickness on the inner wall side of the cooler 304. The base section 307B is formed so as to have a thickness heavier than the thickness of the thin-wall sections 305 formed at the outer circumference of the first radiating section 304B. Likewise, the first radiating section 304B faces an insulating member 333' and forms a base section 307B' having a prescribed thickness on the inner wall side of the cooler 304. The base section 307B' is formed so as to have a thickness heavier than the thickness of the thin-wall sections 305 formed at the outer circumference of the first radiating section 304B.

Likewise, a second radiating section 304C of the cooler 304 faces an insulating member 333 and forms a base section 307C having a prescribed thickness on the inner wall side of the cooler 304. The base section 307C is formed so as to have a thickness heavier than the thickness of the thin-wall sections 305 formed at the outer circumference of the second radiating section 304C. Likewise, the second radiating section 304C faces an insulating member 333' and forms a base section 307C' having a prescribed thickness on the inner wall side of the cooler 304. The base section 307C' is formed so as to have a thickness heavier than the thickness of the thin-wall sections 305 formed at the outer circumference of the second radiating section 304C.

Since the first radiating section 304B and the second radiating section 304C have the thin-wall sections 305 and are divided so as to correspond to the package 301 and the package 301' as stated above, it is possible to displace the thin-wall sections 305 in conformity with the inclination of the surfaces of the insulating member 333 and the insulating member 333'.

Figure 7:
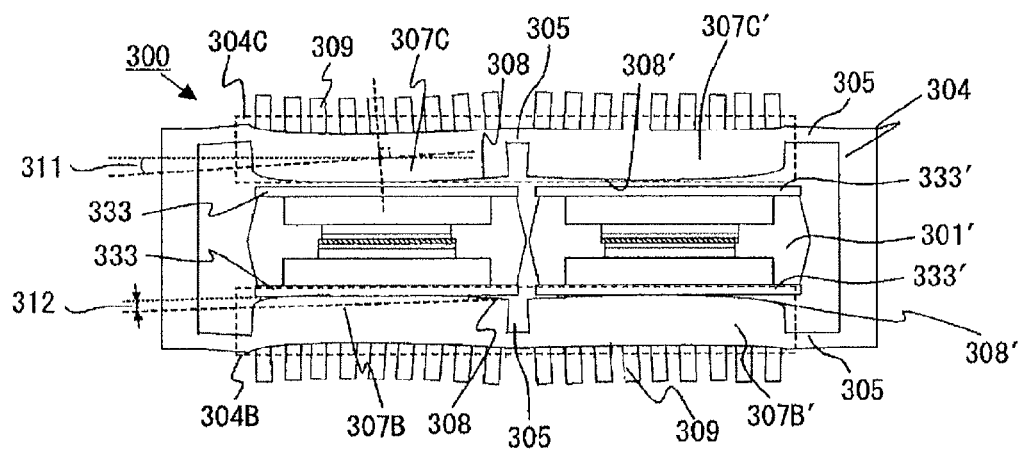
FIG. 7(a) is a sectional view showing a warp 311 of a base section 307C and an inclination 312 of a base section 307B of a cooler 304. (b) is a sectional view showing a state of displacing thin-wall sections 305 and bonding the cooler 304 to a package 301 and a package 301'.
Figure 7:
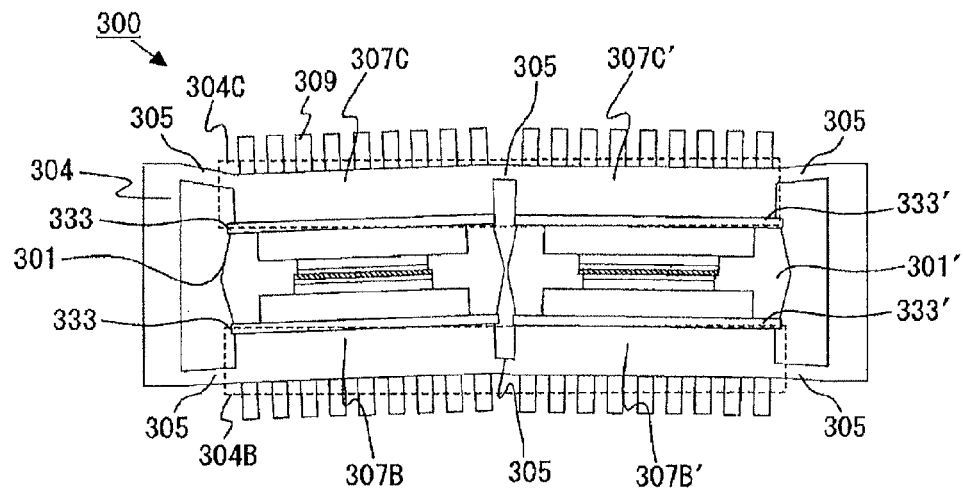

FIG. 7(a) is a sectional view showing a warp 311 of a base section 307C and an inclination 312 of a base section 307B of a cooler 304. FIG. 7(b) is a sectional view showing a state of displacing thin-wall sections 305 and bonding the cooler 304 to a package 301 and a package 301'.

A warp 311 of a base section 307C may undesirably be caused when fins 309 and bonding surfaces 308 are processed. Then an inclination 312 of a base section 307B may undesirably be caused when a whole cooler 304 is formed. From the viewpoint of productivity: a contact area with a cooler 304 increases by coupling two packages 301 and 301' with each other like the present embodiment; hence the variation of thickness and poor contact of insulating members 333 and grease used when necessary are caused by the influence of a warp and variation caused when the cooler 304, the package 301, and the package 301' are manufactured; and resultantly the deterioration of the insulation performance of a power semiconductor module 300 may undesirably be caused.

In the present embodiment however, thin-wall sections 305 can displace minutely in the manner of absorbing a warp 311 and an inclination 312. As a result: the thin-wall sections 305 displace when the surfaces of an insulating member 333 and an insulating member 333' are bonded to a cooler 304 by applying pressure under a high temperature; a package 301 and a package 301' minutely incline respectively; and a first radiating section 304B and a second radiating section 304C are bonded to the package 301 and the package 301' in conformity with the warp 311 and the inclination 312.

Here, although thin-wall sections 305 are formed at both a first radiating section 304B and a second radiating section 304C in the present embodiment, it is also possible to form thin-wall sections 305 only at either the first radiating section 304B or the second radiating section 304C.

Figure 8:
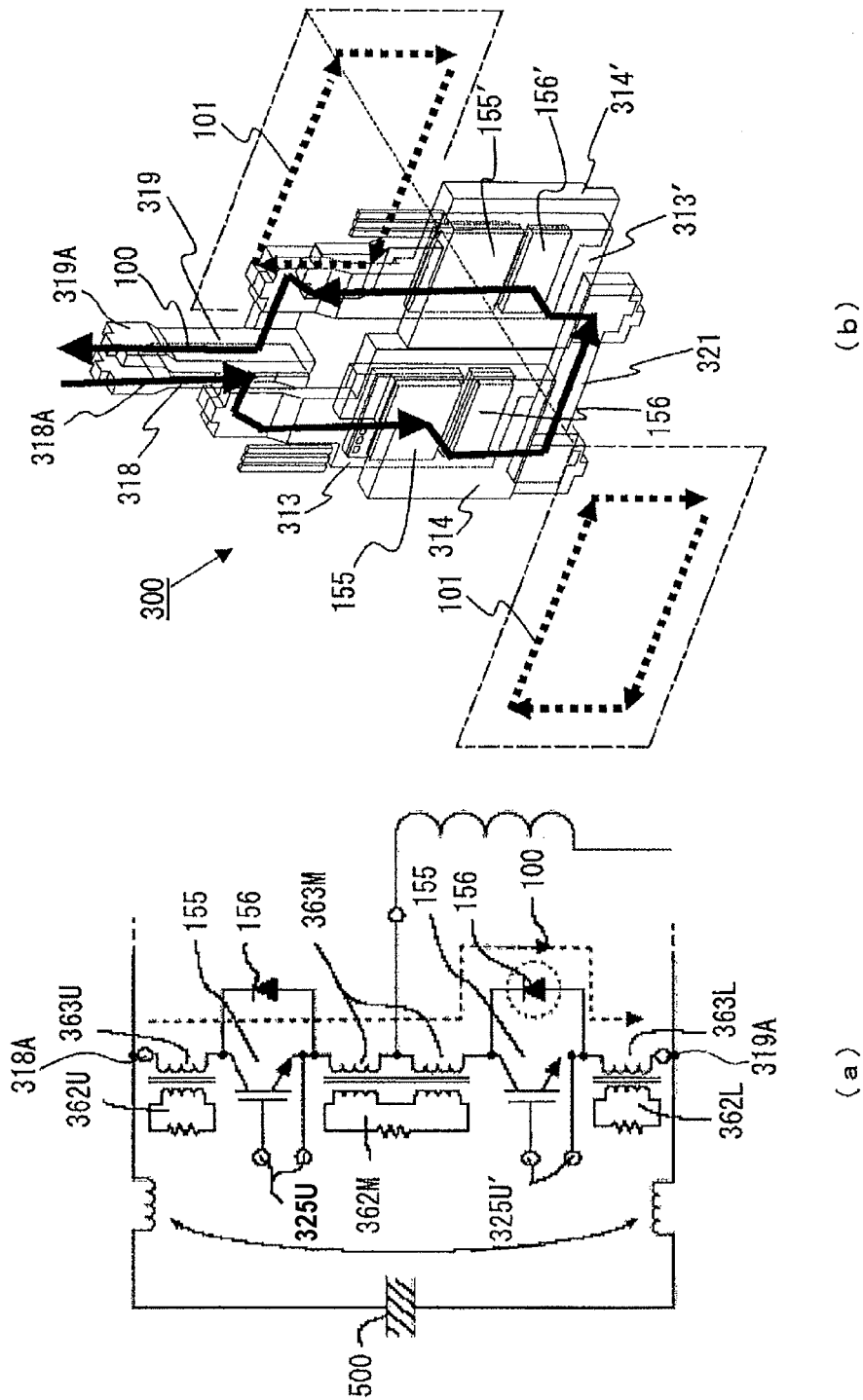
FIG. 8(a) is a circuit diagram showing a route of a recovery current 100 of a diode 156, as one of transit current passing through an upper arm circuit section and a lower arm circuit section in switching operation of an IGBT 155. (b) is a perspective view showing a route of the recovery current 100 flowing in a power semiconductor module 300.

FIG. 8(a) is a circuit diagram showing a route of a recovery current 100 of a diode 156, as one of transit current passing through an upper arm circuit section and a lower arm circuit section in switching operation of an IGBT 155. FIG. 8(b) is a perspective view showing a route of the recovery current 100 of the diode 156 and a diode 156' flowing in a power semiconductor module 300, including the IGBT 155 and an IGBT 155'. The numeral 500 represents a smoothing condenser for smoothening direct current supplied from a battery.

Explanations are made on the basis of the case where an IGBT 155 on an upper arm circuit side is turned on and conducts as shown in FIG. 8(a). On this occasion, a diode 156 on a lower arm circuit side shifts from a forward bias state to a reverse bias state and, in association with that, recovery current 100 flows when carriers in the diode 156 are recombined.

In the present embodiment, by arranging a negative electrode conductor 319 and a positive electrode conductor 318 of a bus bar connector 317 so as to face each other, an identical electric current flows in a reverse direction, magnetic fields 362U and 362L are generated, and wiring inductances 363U and 363L reduce.

Further, an emitter conductor plate 314 and a collector conductor plate 313' are arranged closely to a metal-made cooler 304 through insulating members 333. Likewise, a collector conductor plate 313 and an emitter conductor plate 314' are arranged closely to the metal-made cooler 304 through the insulating members 333. Furthermore, an intermediate connecting conductor 321 is arranged in the metal-made cooler 304 on the other side of an insertion port 306 of the cooler 304 through a package 301 and a package 301'. That is, a route through which recovery current 100 flows is formed in the shape of a loop. As a result, in a power semiconductor module 300, eddy current 101 flowing in a reverse direction is generated in the metal-made cooler 304 when the recovery current 100 flows. By arranging the intermediate connecting conductor 321 as stated above in particular, the eddy current 101 flows along a shape close to a circle and hence the effect of reducing a wiring inductance increases.

The eddy current 101 generates a magnetic field 362M in the direction of negating a magnetic field generated by the recovery current 100, functions so as to compensate a magnetic field, and can reduce a wiring inductance 363M in the cooler 304.

Figure 9:
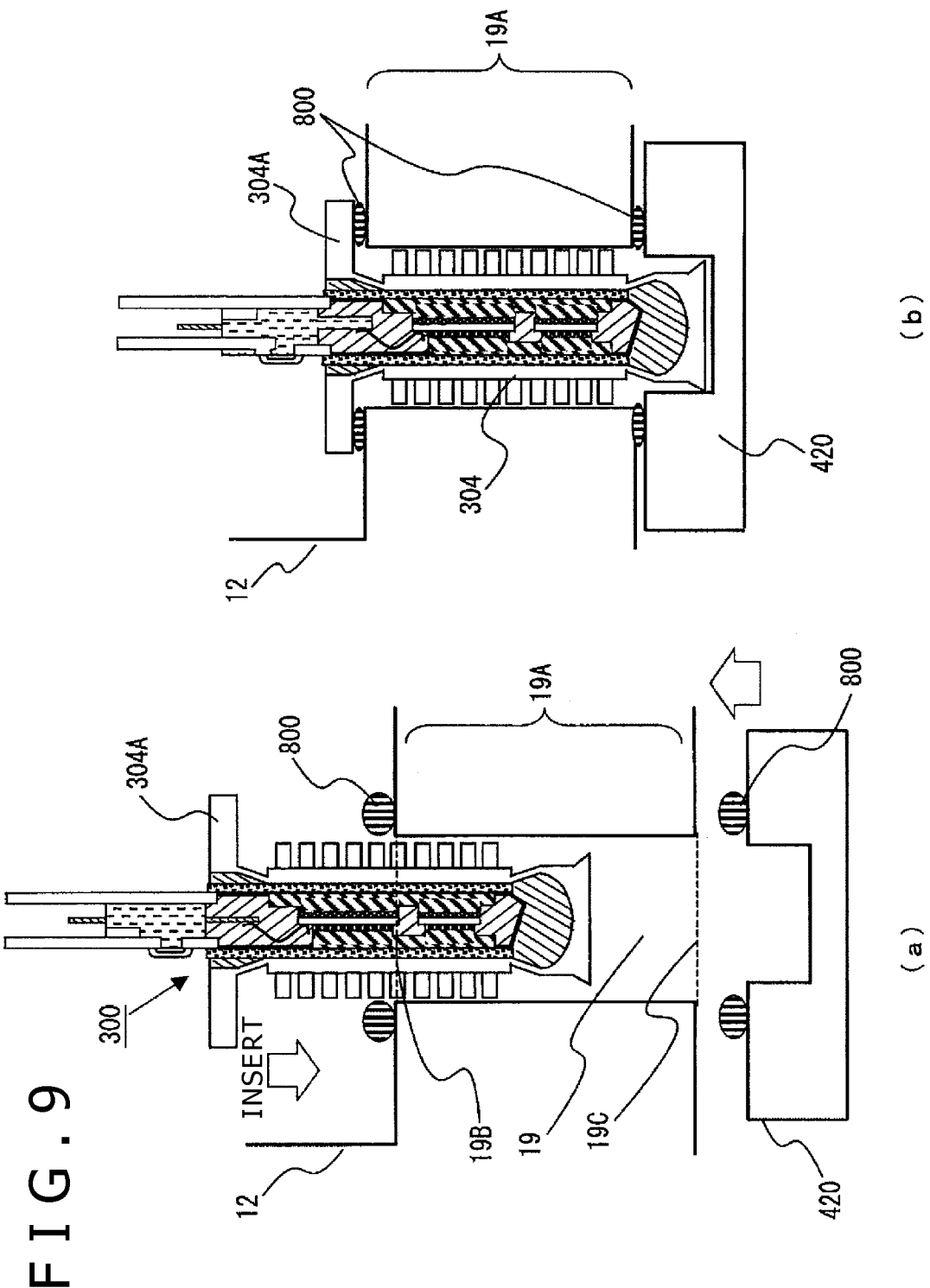
FIGS. 9(a) and (b) are diagrams explaining a process of incorporating a power semiconductor module 300 into a chassis 12 of a power converter.

FIG. 9 comprises views explaining a process of incorporating a power semiconductor module 300 into a chassis 12 of a power converter. The chassis 12 comprises a cooling jacket 19A having a flow channel 19 through which a coolant flows. The cooling jacket 19A has an opening 19B at the upper part and an opening 19C is formed on the other side of the opening 19B through the flow channel 19. A power semiconductor module 300 is inserted from the opening 19B and a coolant is prevented from leaking by a seal 800, a flange 304A of a cooler 304, and a base 420. As the coolant, water is used for example and flows in the direction where an upper arm circuit and a lower arm circuit are arranged, namely in the direction intersecting the insertion direction of the power semiconductor module 300.

In a power semiconductor module 300 according to the present embodiment, since an upper arm circuit section incorporated into a package 301 and a lower arm circuit section incorporated into a package 301' are arrayed in the flowing direction of a coolant, the thickness of the power semiconductor module 300 can be reduced and fluid resistance against the flow of the coolant is inhibited.

Although various embodiments and modified examples are explained heretofore, the present invention is not limited to the contents. Other embodiments conceivable in the scope of the technological thought of the present invention are also included in the present invention.

The contents disclosed in the following priority basic application are incorporated herein by reference. Japanese Patent Application No. 2011-140059 (filed on Jun. 24, 2011)

The invention claimed is:

1. A power semiconductor module comprising:
  a first package having an upper arm circuit section constituting an inverter circuit;

a second package having a lower arm circuit section constituting an inverter circuit;

a metal case having a storage space to store the first package and the second package and an opening connecting with the storage space; and an intermediate connecting conductor to couple the upper arm circuit section with the lower arm circuit section, wherein:

the metal case includes a first radiating section and a second radiating section facing the first radiating section through the storage space, the first package includes a first semiconductor chip, a first conductor plate and a second conductor plate to interpose the first semiconductor chip, a first collector-side terminal coupled with the first conductor plate, a first emitter-side terminal coupled with the second conductor plate, and a first sealant to seal parts of the first conductor plate and the second conductor plate and the first semiconductor chip, the second package includes a second semiconductor chip, a third conductor plate and a fourth conductor plate to interpose the second semiconductor chip, a second collector-side terminal coupled with the third conductor plate, a second emitter-side terminal coupled with the fourth conductor plate, and a second sealant to seal parts of the third conductor plate and the fourth conductor plate and the second semiconductor chip, further, the first package is arranged so that the arrangement direction of the first package and the second package are parallel to the respective surfaces facing the first radiating section and the second radiating section, the first collector-side terminal and the second emitter-side terminal protrude outside the metal case from the opening of the metal case, the intermediate connecting conductor couples the first emitter-side terminal with the second collector-side terminal in the storage space of the metal case, and the first sealant and the second sealant are provided separately from each other.

2. The power semiconductor module according to claim 1, wherein either of the first radiating section and the second radiating section includes a first thin-wall section surrounding a first section facing the first package and being formed so as to be thinner than the first radiating section and a second thin-wall section surrounding a second section facing the second package and being formed so as to be thinner than the second radiating section.

3. The power semiconductor module according to claim 1, wherein the power semiconductor module includes a bus bar connector having a positive-electrode-side bus bar coupled with the first collector-side terminal and a negative-electrode-side bus bar being coupled with the second emitter-side terminal and having a part facing the positive-electrode-side bus bar through an insulating member.

4. The power semiconductor module according to claim 1, wherein the intermediate connecting conductor is arranged on a side opposite to the opening of the metal case through the first package and the second package.

5. A power converter comprising:

the power semiconductor module according to claim 1, and a cooling jacket having a flow channel to feed a coolant, wherein:

the metal case is fixed to the cooling jacket so that the first radiating section and the second radiating section are arranged in the flow channel, and the first radiating section and the second radiating section directly touch the coolant.

* * * * *